(12) United States Patent
Sochava

(10) Patent No.: US 6,940,887 B2
(45) Date of Patent: Sep. 6, 2005

(54) GAIN OPTIMIZING FOR STABLE SINGLE MODE OPERATION OF EXTERNAL CAVITY LASER

(75) Inventor: Sergei Sochava, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 230 days.

(21) Appl. No.: 10/376,361

(22) Filed: Feb. 27, 2003

(65) Prior Publication Data

US 2004/0170208 A1 Sep. 2, 2004

(51) Int. Cl.[7] .................................................. H01S 3/08
(52) U.S. Cl. ........................ 372/92; 372/29.02; 372/20
(58) Field of Search ............................... 372/92, 29.02, 372/29.021, 29.022, 29.023, 30, 31, 32, 20

(56) References Cited

U.S. PATENT DOCUMENTS

| | | | | |
|---|---|---|---|---|
| 5,327,447 A | * | 7/1994 | Mooradian | 372/92 |
| 5,867,305 A | * | 2/1999 | Waarts et al. | 359/337.12 |
| 5,926,494 A | * | 7/1999 | Pepper | 372/70 |
| 6,404,798 B1 | * | 6/2002 | Leckel et al. | 372/108 |
| 6,496,523 B1 | * | 12/2002 | Wach | 372/32 |
| 6,608,847 B2 | * | 8/2003 | Zhang et al. | 372/20 |
| 6,658,034 B2 | * | 12/2003 | Garnache et al. | 372/45 |
| 6,788,726 B2 | * | 9/2004 | Zhang et al. | 372/102 |
| 2001/0040910 A1 | * | 11/2001 | Zhang et al. | 372/102 |

* cited by examiner

*Primary Examiner*—Minsun Oh Harvey
*Assistant Examiner*—James Menefee
(74) *Attorney, Agent, or Firm*—Blakely, Sokoloff, Taylor and Zafman

(57) ABSTRACT

Known laser diode selections are limited to those designed for high power applications (high gain) or those designed for stable single mode operation in an external cavity (low gain). Exponential gain of laser diodes implemented according to embodiments of the present invention is improved (i.e., optimized) to provide both high output power and stability in an external cavity. This is accomplished by controlling the number of quantum wells, light confinement factor, and the transparency current of the laser diode.

23 Claims, 4 Drawing Sheets

GAIN OPTIMIZING FOR STABLE SINGLE MODE OPERATION OF EXTERNAL CAVITY LASER

BACKGROUND

1. Field

Embodiments of the present invention relate to lasers and, in particular, to tunable external cavity diode lasers.

2. Discussion of Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the unprecedented capacity (i.e., bandwidth) offered by optical fibers. Essentially, each channel has its own wavelength, and all wavelengths are separated enough to prevent overlap. The International Telecommunications Union (ITU) currently determines the channel separations.

One link of an optical telecommunication system typically has a transmitter, the optical fiber, and a receiver. The transmitter has a laser, which converts an electrical signal into the optical signal and launches it into the optical fiber. The optical fiber transports the optical signal to the receiver. The receiver converts the optical signal back into an electrical signal.

External cavity diode lasers (ECDL) are attracting increasing attention with optical telecommunication system builders as potential widely tunable light sources. A typical ECDL includes a diode laser gain medium with an antireflection-coated facet and a reflective or partially reflective facet, an end mirror, and a wavelength selection element (optical filter). The end mirror and reflective facet form an external laser cavity. The parameters of the gain medium are usually chosen to maximize the output power of the ECDL. The output power of the ECDL is maximized by, among other things, increasing gain medium gain.

One characteristic of increasing gain medium gain to maximize ECDL output power is that the ECDL may become unstable in single mode and begin multimode lasing. This means that the ECDL begins lasing at different frequencies simultaneously or hops between several frequencies. Multimode lasing is acceptable in some applications, such as when the gain medium is used as a pump laser. However, when the gain medium is used in an application such as a tunable ECDL in an optical communication system such instability may be unacceptable. This is because the diode laser must operate within a very tight range of frequencies and cannot hop from frequency to frequency.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
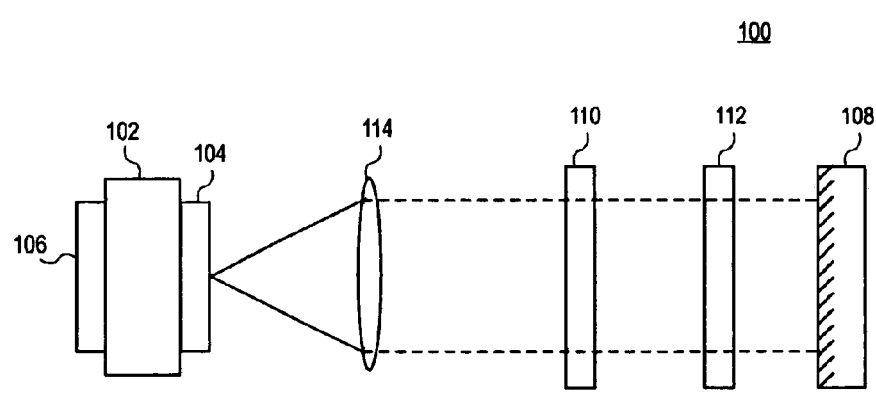
FIG. 1 is a schematic diagram of a tunable external cavity laser (ECDL) according to an embodiment of the present invention.

FIG. 1 is a schematic diagram of an external cavity diode laser (ECDL) 100 according to an embodiment of the present invention. The ECDL 100 includes a gain medium 102 with a first, antireflection-coated facet 104 and a second, reflective, or partially reflective facet 106, collimation lens 114 and an end reflector or mirror 108. The end mirror 108 and reflective facet 106 of the gain medium define the laser cavity. The ECDL 100 has an optical etalon or grid generator 110 that defines a plurality of transmission peaks or channels and a tunable filter or channel selector 112. Coatings, lenses, optical etalons, and tunable filters suitable for implementing the channel selector 112 are known.

The gain medium 102 may be a diode laser. In one embodiment of the present invention, the gain medium 102 is a single spatial mode diode laser. In an alternative embodiment, the gain medium 102 may be any suitable laser gain chip.

The example gain medium 102 has a spontaneous emission gain G for a given current I. In embodiments of the present invention, the dependence of the spontaneous emission gain G on current I may be improved (i.e., optimized) for ECDL 100 applications. In one embodiment, the ECDL 100 may operate at higher currents (well above threshold current $I_{th}$), which increases output power, while maintaining good single mode stability (i.e., no mode hopping).

Exponential spontaneous emission gain G of the gain medium 102 depends on the gain medium current I and can be determined according to the expression:

$$G = G_0 \ln\left[\frac{I}{I_{tr}}\right], \qquad \text{Equation (1)}$$

where $G_0$ is a scalar related to the number of quantum wells in the gain medium 102 and $I_{tr}$ is the transparency current of the gain medium 102, i.e., the current at which the gain medium 102 has zero gain or that provides equal population of the excited and ground states.

If the example gain medium 102 is placed inside an optical cavity (e.g., the ECDL 100), the gain medium 102 starts lasing as soon as the spontaneous emission gain G reaches the total cavity loss a (threshold condition):

$$\alpha = G_0 \ln[I_{th}/I_{tr}], \qquad \text{Equation (2),}$$

where $I_{th}$ is the threshold current of the gain medium 102, i.e., the current at which the ECDL 100 begins lasing. Above the threshold current $I_{th}$ gain medium gain gets clamped to the threshold value described by Equation (2).

The example ECDL 100 has a round trip spontaneous emission gain 2Gd and a round trip lasing gain 2αd, where d is the length of gain medium 102. The round trip spontaneous emission gain 2Gd can be determined using the expression:

$$2Gd = 2G_0 \, d \, \ln[I_0/I_{tr}] \qquad \text{Equation (3),}$$

and the round trip lasing gain can be determined using the expression:

$$2\alpha d = 2G_0 \, d \, \ln[I_{th}/I_{tr}], \qquad \text{Equation (4),}$$

where $I_0$ is the operating current of the ECDL 100. The operating current $I_0$ may be determined by the particular application for the ECDL 100 (e.g., communications, spectroscopy, etc.).

In one embodiment of the present invention, the dependence of the spontaneous emission gain G on current I may be improved (i.e., optimized) for ECDL 100 applications by controlling (e.g., reducing) the "gain dynamic reserve" GDR of the ECDL 100. The gain dynamic reserve GDR is defined herein as the difference between the round trip spontaneous emission gain 2Gd and the round trip lasing gain 2αd. Gain dynamic reserve GDR can be determined using the expression:

$$GDR = 2G_0 d \ln\left[\frac{I_0}{I_{th}}\right]. \qquad \text{Equation (5)}$$

In other embodiments the dependence of the spontaneous emission gain G on current I is improved (i.e., optimized) for other applications. After reading the description herein, a person of ordinary skill will readily recognize how to control exponential gain G to implement various embodiments of the present invention.

Figure 2:
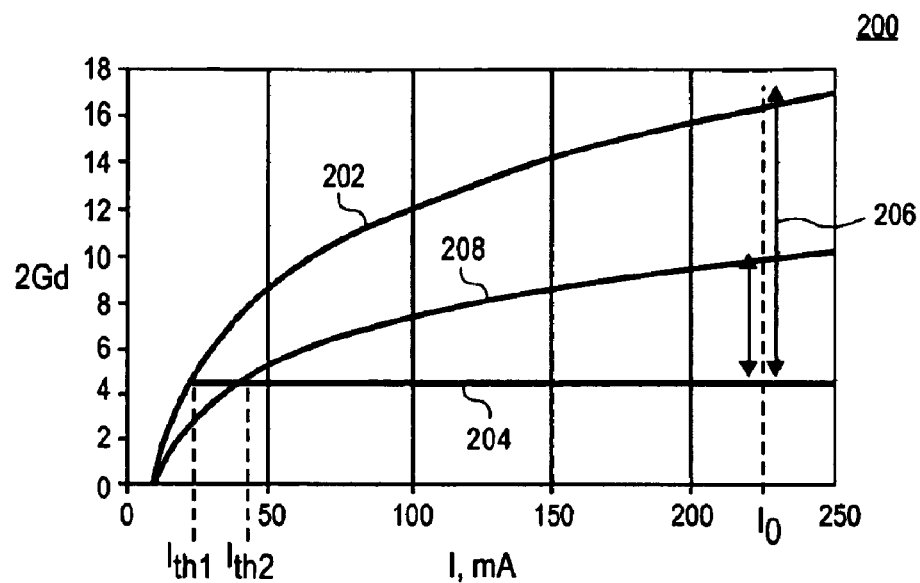
FIG. 2 is a graphical representation illustrating round trip exponential gain 2Gd as a function of current according to an embodiment of the present invention.

FIG. 2 is a graphical representation 200 illustrating an embodiment of the present invention in which the dependence of the spontaneous emission gain G on current I is improved (i.e., optimized) to ensure stable single mode operation of the ECDL 100. The graphical representation 200 shows round trip exponential gain as a function of current I. A curve 202 represents round trip spontaneous emission gain 2Gd where the scalar $2G_0d$ is five (5) and transparency current $I_{tr}$ is nine (9) mA. A curve 204 illustrates round trip lasing gain 2αd. A distance 206 between the curve 202 and the curve 204 measured at operating current $I_0$ illustrates gain dynamic reserve GDR.

In the embodiment illustrated in FIG. 2, the scalar $2G_0d$ is reduced from five (5) to three (3), which reduces the gain dynamic reserve GDR of the ECDL 100 from 11.7 to less than six (e.g., 5.1). A curve 208 represents round trip spontaneous emission gain 2Gd using the scalar $2G_0d$ of three (3).

The curve 208 also shows that the reduction of the scalar $2G_0d$ results in an increase in threshold current $I_{th}$ from $I_{th1}$ to $I_{th2}$. The increase in threshold current $I_{th}$ reduces output power P, which is proportional to the difference between operating current $I_0$ and threshold current $I_{th}$. Reducing gain dynamic reserve GDR according to this embodiment provides a more stable ECDL 100, but sacrifices power performance of the ECDL 100 because the threshold current $I_{th}$ is increased.

Figure 3:
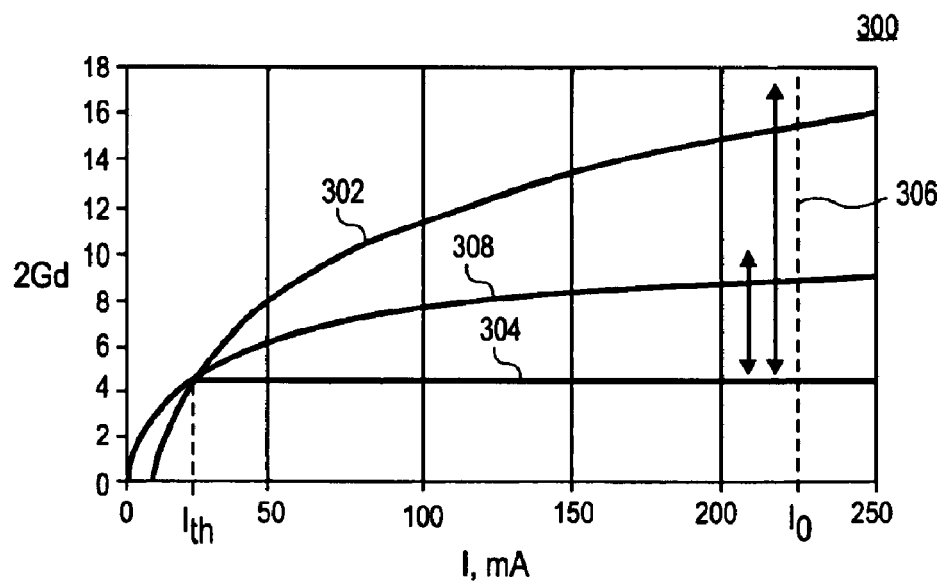
FIG. 3 is a graphical representation illustrating round trip exponential gain 2Gd as a function of current according to an alternative embodiment of the present invention.

FIG. 3 is a graphical representation 300 illustrating an alternative embodiment of the present invention in which the dependence of the spontaneous emission gain G on current I is improved (i.e., optimized) to ensure stable single mode operation of the ECDL 100. The graphical representation 300 shows round trip exponential gain 2Gd as a function of current I. A curve 302 represents round trip spontaneous emission gain 2Gd where the scalar $2G_0d$ is five (5) and transparency current $I_{tr}$ is nine (9) mA. A curve 304 illustrates round trip lasing gain 2αd. A distance 306 between the curve 302 and the curve 304 at operating current $I_0$ illustrates gain dynamic reserve GDR.

In the embodiment illustrated in FIG. 3, the scalar $2G_0d$ is reduced from five (5) to two (2) and the transparency current $I_{tr}$ is reduced from nine (9) mA to 2.4 mA. A curve 308 represents round trip spontaneous emission gain 2Gd for the gain medium with reduced scalar $2G_0d$ and transparency current $I_{tr}$. Reducing gain dynamic reserve GDR measured at operating current $I_0$ from 11.7 to less than approximately six (e.g., 4.6) while maintaining a constant threshold current $I_{th}$ results in a good single mode stability as well as high output power P for the example ECDL 100.

The scalar $G_0$ and/or the transparency current $I_{tr}$ may be controlled by controlling the number of quantum wells in the gain medium 102, the width of the quantum wells in the gain medium 102, the dopants in the gain medium 102, the crystalline lattice mismatch in the gain medium 102, and/or the light confinement factor of the gain medium 102. Implementation of these and other embodiments of the present invention are described with reference to FIG. 4.

Figure 4:
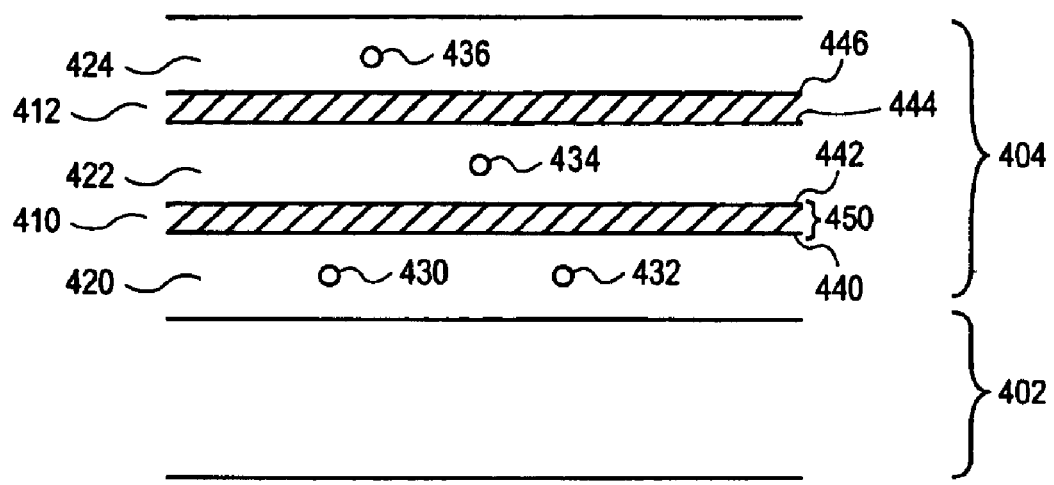
FIG. 4 is a schematic cross-section of a gain medium according to an embodiment of the present invention.

FIG. 4 is a schematic cross section diagram of the example gain medium 102 according to embodiments of the present invention. The gain medium 102 includes a substrate layer 402 and an active layer 404. The active layer has quantum wells 410 and 412 and barrier layers 420, 422, and 424. The barrier layers 420, 422, and 424 may be n- or p-doped InP layers. The quantum well layers 410 and 412 may be InGaAsP layers. After reading the description herein, a person of ordinary skill will readily recognize how to fabricate gain media using various materials according to embodiments of the present invention. One such fabrication technique includes well-known or proprietary metalorganic chemical vapor deposition (MOCVD) growth techniques.

There may be one or more dopants 430, 432, 434, 436 in the barrier layers 420, 422, and 424. In one embodiment of the present invention, the barrier layers 420, 422, and 424 may be doped with an n-type dopant, such as sulfur (S), selenium (Se), tellurium (Te), or other suitable dopant to control (e.g., reduce) the transparency current $I_{tr}$ of the gain medium 102. After reading the description herein, a person of ordinary skill will readily recognize how to dope the barrier layers 420, 422, and 424 to control transparency current $I_{tr}$ for various embodiments of the present invention.

There is a crystalline lattice mismatch 440 between the material in the quantum well layer 410 and the material in the barrier layer 420 and a crystalline lattice mismatch 442 between the material in the quantum well layer 410 and the material in the barrier layer 422 (also called strained quantum wells or strained layer structures). Likewise, there is a crystalline lattice mismatch 444 between the material in the quantum well layer 412 and the material in the barrier layer 422 and a crystalline lattice mismatch 446 between the material in the quantum well layer 412 and the material in the barrier layer 424. In one embodiment of the present invention, the crystalline lattice mismatch between the material in the quantum well layers 410, 412 and the material in the barrier layers 420, 422, and 424 is controlled (e.g., increased) to reduce transparency current $I_{tr}$.

For example, for $In_{1-x}Ga_xAs_yP_{1-y}$ quantum well layers 410, 412 and InP barrier layers 420, 422, and 424, lowering x from 0.47y to 0.32y results in approximately a one percent crystalline lattice mismatch between the material in the quantum well layers 410, 412 and the material in the barrier layers 420, 422, and 424. The approximately one percent lattice mismatch results in a compressive strain of the quantum wells, which reduces the transparency current $I_{tr}$. As the crystalline lattice mismatch increases, compressive strain increases and transparency current $I_{tr}$ decreases. After reading the description herein, a person of ordinary skill will readily recognize how to strain quantum well layers 410 and/or 412 to lower transparency current $I_{tr}$ for various other embodiments of the present invention.

Each of the quantum well layers has a width 450, although only one is shown for the quantum well layer 410. In one embodiment, the width 450 of the quantum well layers 410 and 412 in the active layer 404 is approximately five (5) to ten (10) nanometers, which provides a relatively low transparency current $I_{tr}$. After reading the description herein, a person of ordinary skill will readily recognize how to fabricate the active layer 404 to control (e.g., provide lower or higher) transparency current $I_{tr}$ for various other embodiments of the present invention.

In another embodiment, the number of quantum wells in the active layer 404 is controlled (e.g., reduced) to control (e.g., reduce) gain dynamic reserve GDR. For example, the number of quantum wells in the active layer 404 may be reduced from approximately four to six quantum wells to approximately two to three quantum wells. In this embodiment, a scalar $G_0$ of approximately 28–42 cm$^{-1}$ may be reduced to approximately 14–21 cm$^{-1}$. After reading the description herein, a person of ordinary skill will readily recognize how to control (e.g., reduce or increase) the number of quantum wells to control the scalar $G_0$ for various other embodiments of the present invention.

The gain medium 102 has a light confinement factor $\Gamma$, which is the ratio of the volume of the active layer 404 occupied by excited electrons V to the volume of the gain medium 102 occupied by photons $V_p$. The volume of the active layer 404 occupied by excited electrons V is controlled by the current confinement of the gain medium 102. The volume of the gain medium 102 occupied by photons $V_p$ is controlled by the refractive index profile of the gain medium 102. The scalar $G_0$ is proportional to the light confinement factor $\Gamma$.

In one embodiment of the present invention, the current confinement is tightened (i.e., a smaller volume of the active layer 404 is occupied by excited electrons), which reduces the light confinement factor $\Gamma$. Reducing the light confinement factor $\Gamma$ reduces gain dynamic reserve GDR. After reading the description herein, a person of ordinary skill will readily recognize how to control (e.g., increase or reduce) the light confinement factor $\Gamma$ for various other embodiments of the present invention.

Note that in embodiments of the present invention, either the scalar $G_0$ or the transparency current $I_{tr}$ may be controlled separately or both may be controlled simultaneously. This "decoupling" of the scalar $G_0$ from the transparency current $I_{tr}$ allows a laser designer to adjust gain dynamic reserve GDR and the threshold current $I_{th}$ independently, which provides both stable single mode operation and high output power for the ECDL 100.

Figure 5:
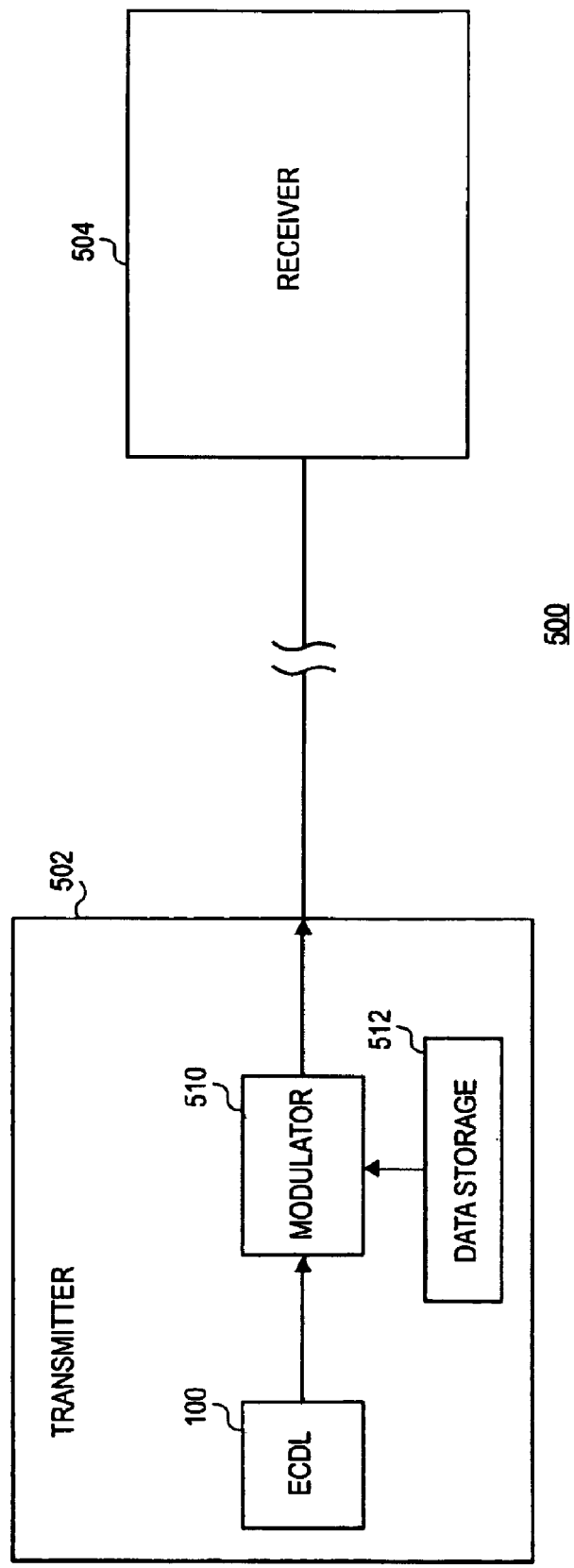
FIG. 5 is a high-level block diagram of an optical system according to an embodiment of the present invention.

FIG. 5 is a high-level block diagram of an optical system 500 according to an embodiment of the present invention. The example optical system 500 includes a transmitter 502 that transmits an optical signal to a receiver 504.

The transmitter 502 may include the ECDL 100, a modulator 510, and a data source 512. The data source 512 provides the data to be transmitted in the optical system 500. For example, the data source 512 may provide data, voice, graphics, video, etc. Data sources are well known. The modulator 510 modulates a laser beam from ECDL 100 according to the data from the data source 512. Modulators are well known.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms used in the following claims should not be construed to limit the invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
    subtracting a round trip lasing gain of an external cavity diode laser from a round trip spontaneous emission gain at an operating current to obtain a gain dynamic reserve of the external cavity diode laser; and
    reducing gain dynamic reserve of the external cavity diode laser to improve stability of the external cavity diode laser.

2. The method of claim 1, wherein reducing gain dynamic reserve comprises reducing a number of quantum wells in a gain medium in the external cavity diode laser.

3. The method of claim 1, further comprising reducing a light confinement factor of a gain medium in the external cavity diode laser.

4. The method of claim 1, further comprising reducing transparency current of a gain medium to increase output power of the external cavity diode laser.

5. The method of claim 4, further comprising controlling dopants in the gain medium.

6. The method of claim 4, further comprising increasing a crystalline lattice mismatch between quantum wells and barrier layers in the gain medium.

7. The method of claim 4, further comprising controlling widths of quantum wells in the gain medium.

8. An external cavity diode laser, comprising:
a gain dynamic reserve GDR of less than approximately six; and
stable single mode operation.

9. The apparatus of claim 8, wherein a number of quantum wells is three or fewer.

10. The apparatus of claim 9, wherein each quantum well has a width between approximately five and ten nanometers.

11. The apparatus of claim 9, wherein each quantum well is an InGaAsP quantum well.

12. The apparatus of claim 8, further comprising at least one of a S, Se, or Te dopant in a gain medium of the external cavity diode laser.

13. The apparatus of claim 8, further comprising a crystalline lattice mismatch between a barrier layer and a quantum well layer in a gain medium in the external cavity diode laser.

14. A method, comprising:
determining a gain dynamic reserve GDR for an external cavity diode laser using an expression $$GDR = 2G_0 d\ln\left[\frac{I_0}{I_{th}}\right];$$

and
forming a gain medium for the external cavity diode laser, the gain medium having a gain dynamic reserve GDR less than approximately six.

15. The method of claim 14, further comprising forming a number of quantum wells in the gain medium associated with a gain dynamic reserve of less than approximately six.

16. A system, comprising:
a transmitter having an external cavity diode laser, the external cavity diode laser having a gain dynamic reserve of less than approximately six and stable single mode operation; and
a receiver coupled to the transmitter.

17. The system of claim 16, wherein the transmitter further comprises a modulator coupled to the external cavity diode laser.

18. The system of claim 17, wherein the transmitter further comprises a data source coupled to the modulator.

19. A method, comprising:
determining a first gain dynamic reserve and a first threshold current for an external cavity diode laser, the first gain dynamic reserve and the first threshold current providing a first mode stability and a first output power, respectively; and
forming a number of quantum wells in a gain medium active region in the external cavity diode laser associated with a second gain dynamic reserve and a second threshold current for the external cavity diode laser, the second gain dynamic reserve and the second threshold current providing a second mode stability better than the first mode stability and the second output power lower than the first output power, respectively.

20. The method of claim 19, further comprising:
determining a third gain dynamic reserve and a third threshold current for the external cavity diode laser, the third gain dynamic reserve and the third threshold current providing a third mode stability better than the first mode stability and a third output power higher than the first output power, respectively; and
forming a width for a number of quantum wells associated with the third gain dynamic reserve and the third threshold current, the width of the quantum wells associated with the third gain dynamic reserve and the third threshold current being optimized to reduce the transparency current.

21. The method of claim 20, further comprising:
determining a fourth gain dynamic reserve and a fourth threshold current for the external cavity diode laser, the fourth gain dynamic reserve and the fourth threshold current having a fourth mode stability better than the third mode stability and the fourth output power higher than the first output power, respectively; and
generating a light confinement factor in the gain medium active region associated with the fourth gain dynamic reserve and the fourth threshold current in the external cavity diode laser, the light confinement factor associated with the fourth gain dynamic reserve and the fourth threshold current being less than a light confinement factor associated with the third gain dynamic reserve and the third threshold current, respectively.

22. The method of claim 19, further comprising:
determining a third gain dynamic reserve and a third threshold current for the external cavity diode laser, the third gain dynamic reserve and the third threshold current having a third mode stability better than the first mode stability and a third output power higher than the first output power, respectively; and
doping the gain medium active region with dopants associated with the third gain dynamic reserve and the third threshold current, the dopants associated with the third gain dynamic reserve and the third threshold current being different from dopants associated with the second gain dynamic reserve and the second threshold current, respectively.

23. The method of claim 19, further comprising:
determining a third gain dynamic reserve and a third threshold current for the external cavity diode laser, the third gain dynamic reserve and the third threshold current having a third mode stability better than the first mode stability and a third output power higher than the first output power, respectively; and
forming a crystalline lattice mismatch between at least one barrier layer in the gain medium active region and at least one quantum well layer in the gain medium active region associated with the third gain dynamic reserve and the third threshold current in the external cavity diode laser, the crystalline lattice mismatch associated with the third gain dynamic reserve and the third threshold current being greater than a crystalline lattice mismatch associated with the second gain dynamic reserve and the second threshold current, respectively.

* * * * *